(12) United States Patent
Arutinov

(10) Patent No.: US 11,173,737 B2
(45) Date of Patent: Nov. 16, 2021

(54) METHOD AND SYSTEM FOR APPLYING A PATTERNED STRUCTURE ON A SURFACE

(71) Applicant: Nederlandse Organisatie voor toegepast-natuurwetenschappelijk onderzoek TNO, 's-Gravenhage (NL)

(72) Inventor: Gari Arutinov, Eindhoven (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 16/327,458

(22) PCT Filed: Aug. 25, 2017

(86) PCT No.: PCT/NL2017/050557
§ 371 (c)(1),
(2) Date: Feb. 22, 2019

(87) PCT Pub. No.: WO2018/038613
PCT Pub. Date: Mar. 1, 2018

(65) Prior Publication Data
US 2019/0193444 A1 Jun. 27, 2019

(30) Foreign Application Priority Data
Aug. 26, 2016 (EP) .................... 16185987

(51) Int. Cl.
*B41M 3/00* (2006.01)
*H01L 51/00* (2006.01)

(52) U.S. Cl.
CPC ......... *B41M 3/006* (2013.01); *H01L 51/0013* (2013.01); *B41M 2205/08* (2013.01)

(58) Field of Classification Search
None
See application file for complete search history.

(56) References Cited

U.S. PATENT DOCUMENTS

| | | | | |
|---|---|---|---|---|
| 2009/0305445 | A1* | 12/2009 | Ikeda | H01L 51/0013 |
| | | | | 438/29 |
| 2012/0091482 | A1* | 4/2012 | Uchida | C23C 14/048 |
| | | | | 257/88 |
| 2018/0015671 | A1* | 1/2018 | Sandstrom | B23K 26/062 |

FOREIGN PATENT DOCUMENTS

| CN | 1797713 A | 7/2006 |
|---|---|---|
| CN | 102113413 A | 6/2011 |

(Continued)

OTHER PUBLICATIONS

European Patent Office, International Search Report in corresponding International Application No. PCT/NL2017/050557, dated Dec. 22, 2017 (3 pages).

(Continued)

*Primary Examiner* — Jose I Hernandez-Kenney
(74) *Attorney, Agent, or Firm* — Leydig, Voit & Mayer, Ltd.

(57) ABSTRACT

A method for applying a patterned structure on a surface, comprising providing a donor substrate (1) comprising donor material (1a) between a light source (3) and a receiving surface (5), providing by means of the light source (3) a light pulse (3a) directed to the donor substrate (1), the light pulse (3a) being configured to cause the donor material (1a) to be transferred from the donor substrate (1) onto the receiving surface (5), wherein the donor substrate (1) comprises a pattern (2) of donor material (1a) on discrete portions (2a) of the donor substrate (1). The pattern (2) on the donor substrate (1) is transferred so as to form a pattern (4) of donor material (1a) on the receiving surface (5).

12 Claims, 9 Drawing Sheets

(56) References Cited

FOREIGN PATENT DOCUMENTS

| CN | 102845134 A | 12/2012 | | |
|---|---|---|---|---|
| CN | 104345576 A | 2/2015 | | |
| CN | 105572959 A | 5/2016 | | |
| EP | 1646094 A1 | 4/2006 | | |
| EP | 2309823 A1 | 4/2011 | | |
| EP | 2555594 A1 | 2/2013 | | |
| JP | 2010-015981 A | 1/2010 | | |
| JP | 2011-040186 A | 2/2011 | | |
| JP | 2013-191553 A | 9/2013 | | |
| JP | 2017-501431 A | 1/2017 | | |
| WO | WO-2007111341 A1 | * | 10/2007 | ........... B29C 39/148 |
| WO | WO 2008/090801 A1 | | 7/2008 | |
| WO | WO-2015065182 A1 | * | 5/2015 | ........... G03F 7/2008 |
| WO | WO 2016/124708 A1 | | 8/2016 | |

OTHER PUBLICATIONS

Japanese Patent Office, Office Action in corresponding Japanese Application No. 2019-532912 dated Jul. 1, 2021.

* cited by examiner

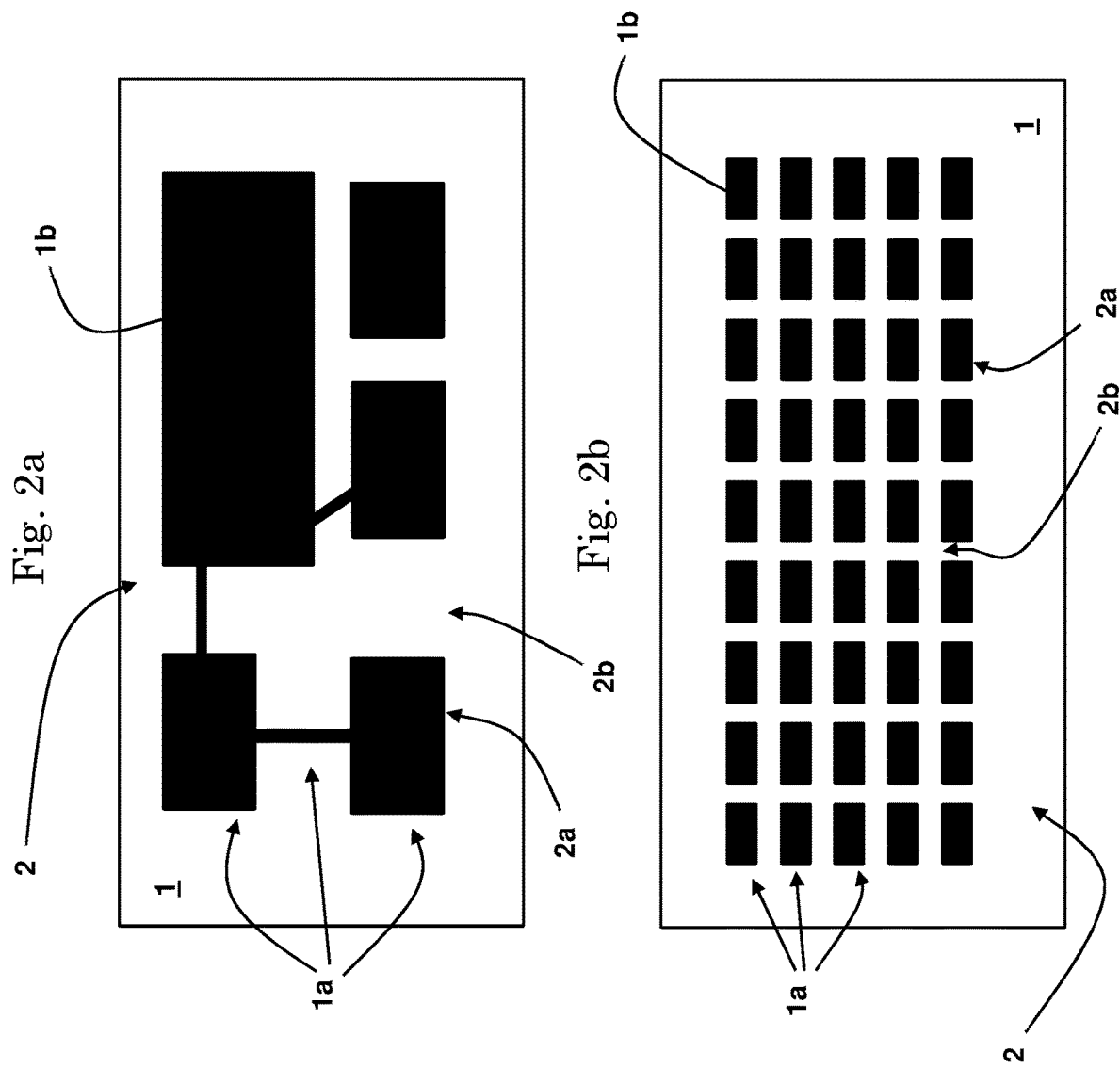

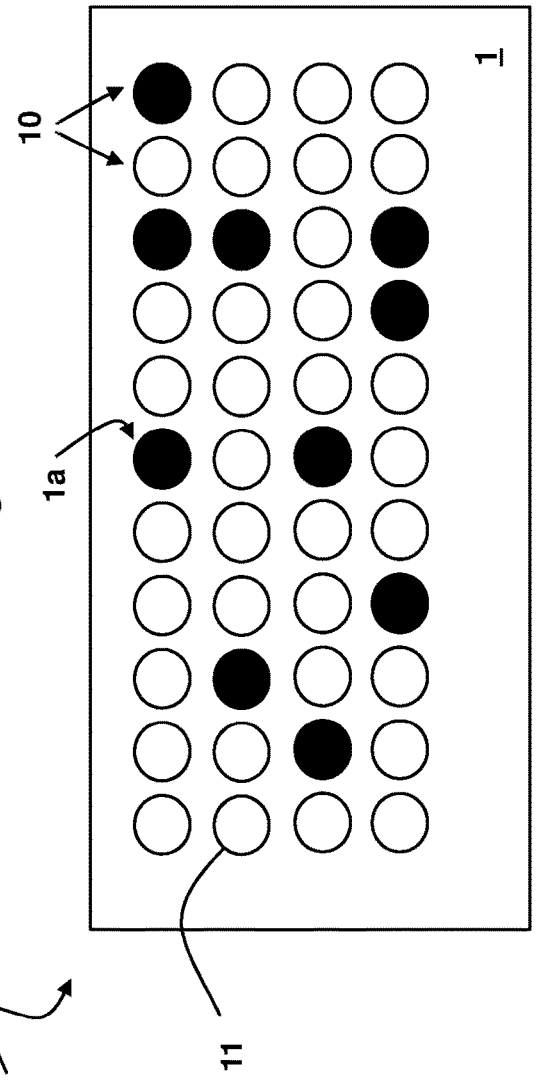
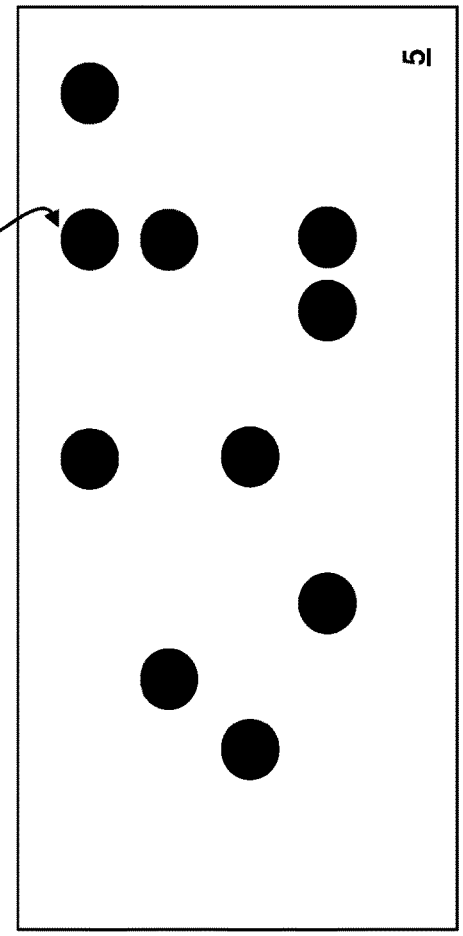

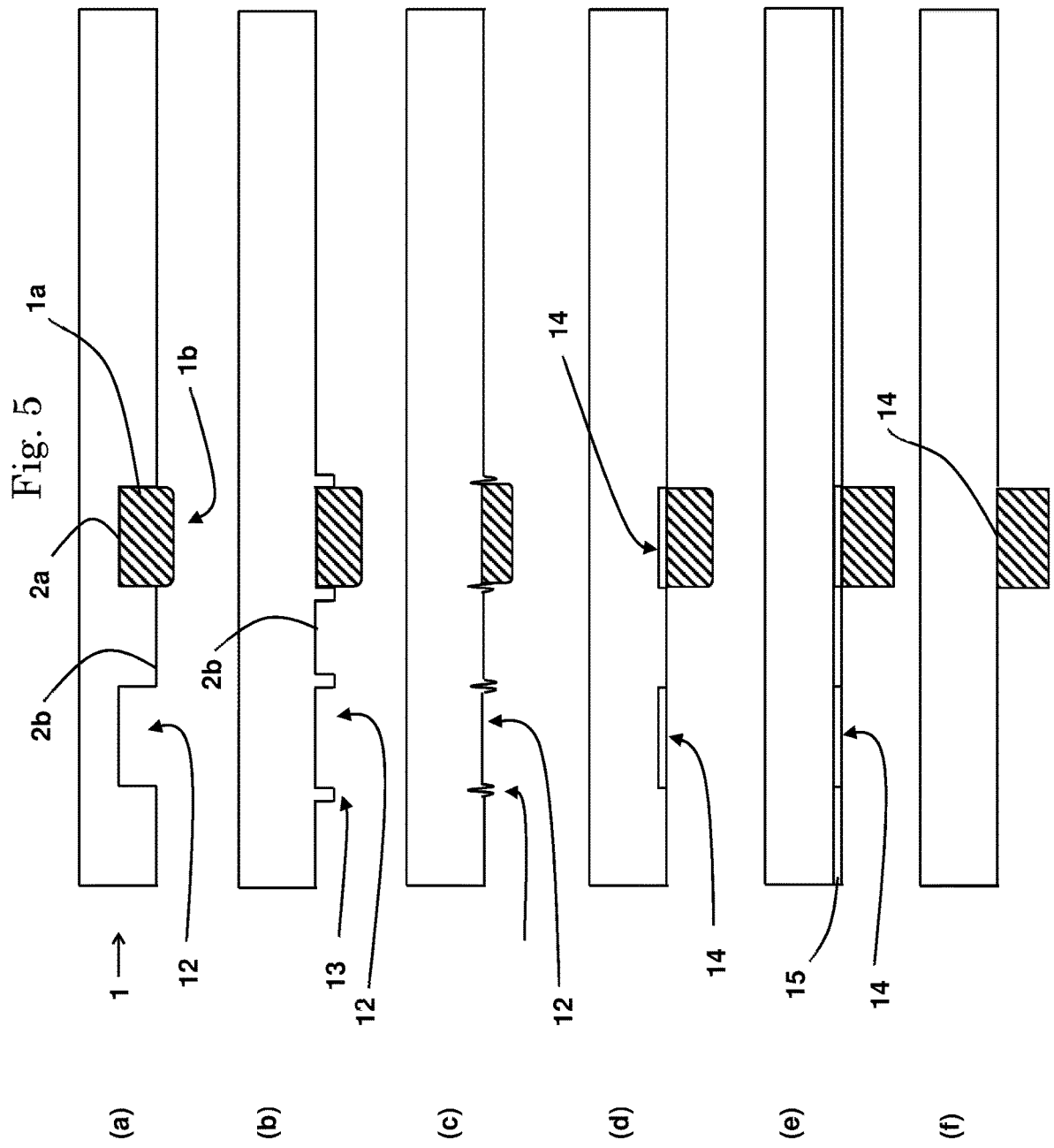

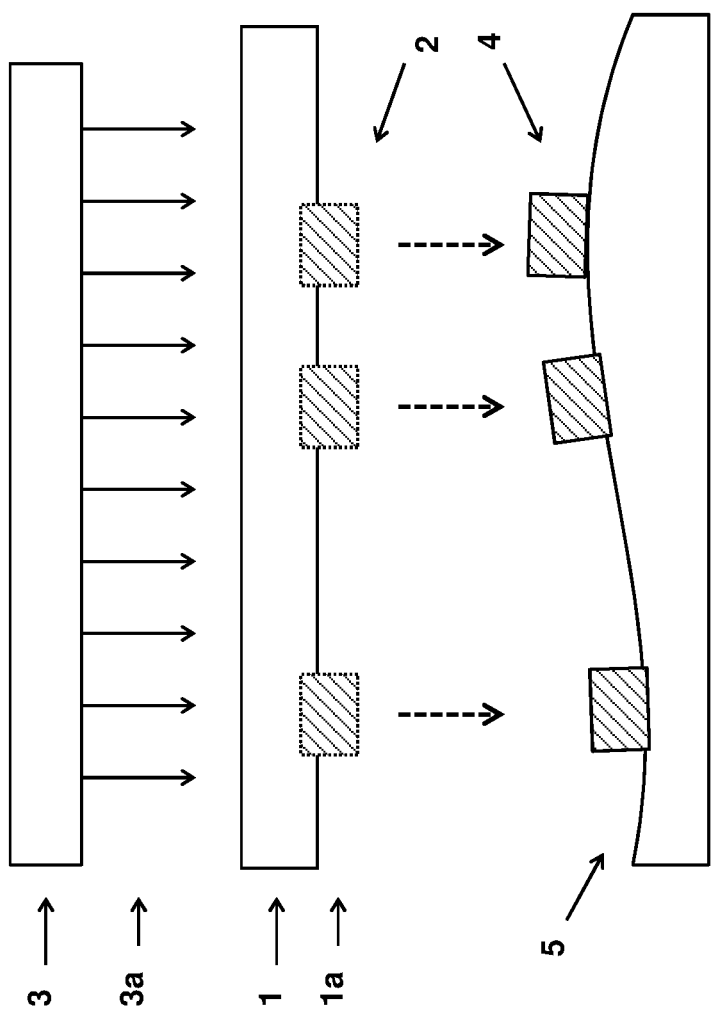

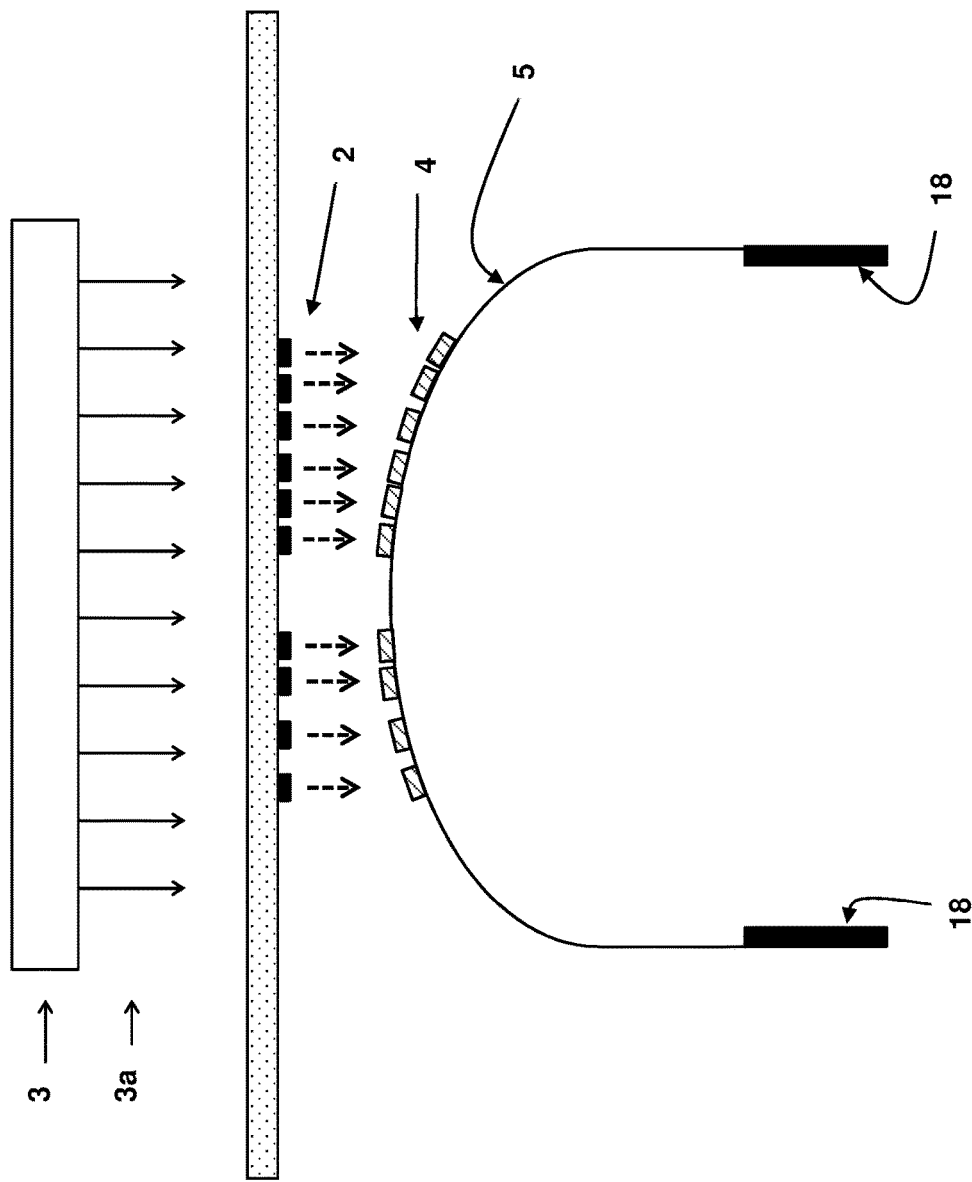

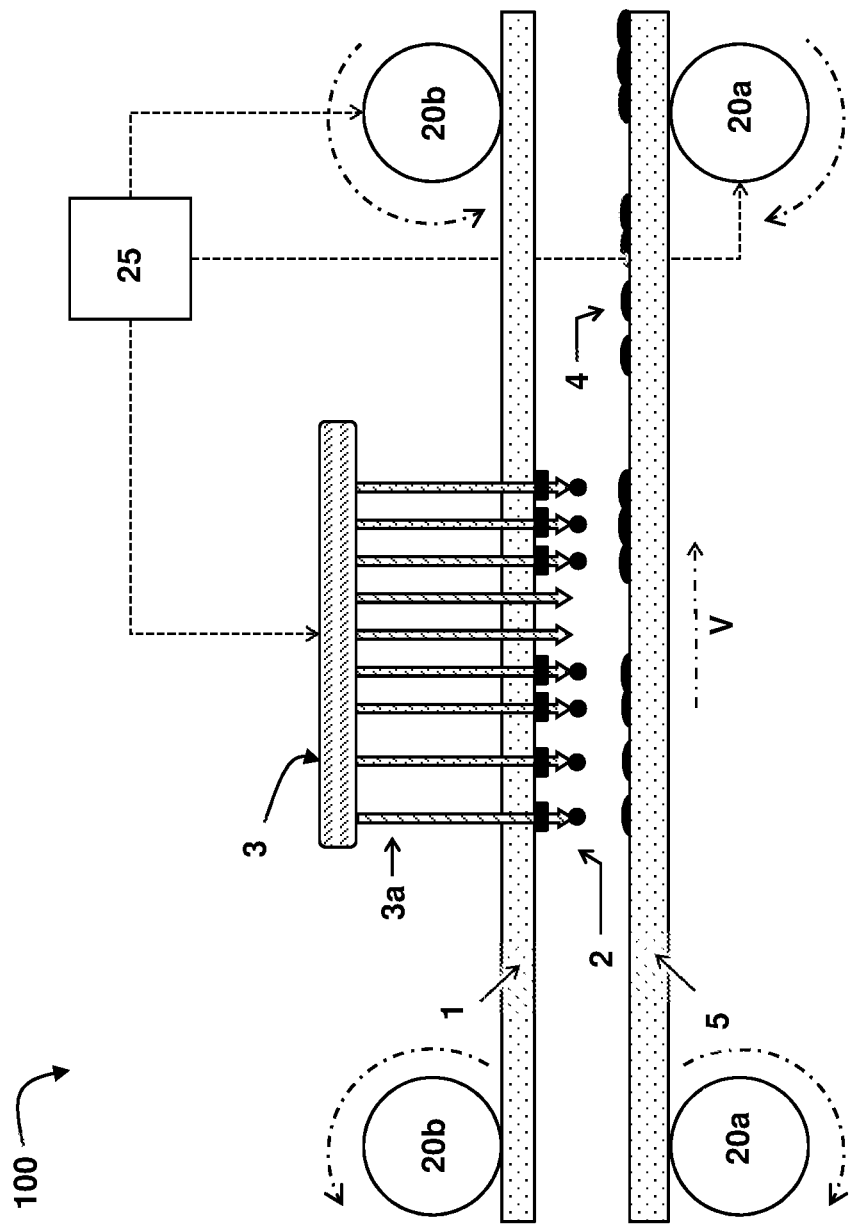

METHOD AND SYSTEM FOR APPLYING A PATTERNED STRUCTURE ON A SURFACE

CROSS-REFERENCE TO RELATED APPLICATIONS

This patent application is a U.S. National Phase of PCT international Application No. PCT/NL2017/050557, filed Aug. 25, 2017, which claims priority to European Application No. 16185987.1, filed Aug. 26, 2016, which are both expressly incorporated by reference in their entireties, including any references contained therein.

FIELD AND BACKGROUND

The present disclosure relates to a method and system for applying a patterned structure on a surface.

Applying a patterned structure, for instance made out of conductive pastes, on a surface or substrate can play an important role for the fabrication of various electronic devices. Both contact and non-contact methods are known for providing patterned conductive structures.

In publication WO 2015/065182 A1, a patterned structure is formed on an acceptor substrate by providing a donor substrate comprising donor material between a light source and the acceptor substrate and directing a pattern of light to the donor substrate such as to transfer donor material from the donor substrate to the acceptor substrate. The patterned light needs to be configured to substantially match the patterned structure to be created on the acceptor substrate. The donor substrate is impinged by the patterned light causing the donor material to be released from the donor substrate and transfer to the acceptor substrate to form the patterned structure thereon. This takes place only on locations where patterned light beams are directed to. A light patterning mask is employed for obtaining such patterned light, wherein the mask comprises a mask pattern arranged between the light source and the donor substrate for appropriately patterning the light coming from the light source. The mask divides light coming from the light source into a plurality of beams which are directed to the donor substrate, such as to form a mask-specific pattern. The donor substrate has a donor material layer distributed over an entire surface, such that the patterned light impinges on the donor material and results in the transfer of donor material in accordance with the provided pattern.

Patterning of light typically requires the use of a mask. The arrangement of light patterning masks between the light source and the donor substrate does not only increase complexity of the set-up, but does also increase the production costs, which can result in more expensive end products. The masks are permanent and can only transfer a mask-specific pattern, while typically tending to be relatively expensive. Moreover, the masks are not customizable, wherein for a different pattern a different (expensive) mask has to be employed. Furthermore, often the re-use capabilities of the employed light patterning masks can be limited, so that frequent replacements may be necessary. In addition, only a part of the donor material on the donor substrate is eventually used, wherein, after use, the donor substrate with residual donor material still attached thereto is disposed of as a waste product in the fabrication process.

Accordingly, there remains a need for improvement in forming a patterned structure on a substrate, e.g. faster, more reliable, cost-effective, more efficient, customizable, etc.

SUMMARY

There is a need for a method and a system that obviates at least one of the above mentioned drawbacks.

Accordingly, a first aspect of the present disclosure provides a method for applying a patterned structure on a surface. The method comprises providing a donor substrate comprising a donor material between a light source and a receiving surface, providing by means of the light source a light pulse directed to the donor substrate, wherein the light pulse is configured to cause the donor material to be transferred from the donor substrate onto the receiving surface. The donor material forms a pattern of material portions at one or more occupied regions of the donor substrate with the donor material attached thereto and one or more unoccupied regions of the donor substrate free of the donor material. The unoccupied regions are interspersed between the occupied regions. The pattern of donor material on the donor substrate is transferred as a whole by the light pulse so as to form a resulting pattern of donor material on the receiving surface.

The one or more occupied regions of the donor substrate having donor material will be irradiated by means of the light pulse, so that the donor material can be transferred to the receiving surface. The one or more unoccupied regions of the donor substrate can actually also be irradiated by means of the light pulse, but since there is no donor material in those regions, no donor material will be transferred from those regions onto the receiving surface. A light pulse with a sufficiently high light intensity impinging on the donor substrate comprising the pattern of donor material can enable transfer of the donor material to the receiving surface. The donor material (e.g. solder paste, glue, conductive tracks, etc.) of a desired pattern can be transferred from a donor substrate to a receiving substrate with a single pulse of a light source (e.g. flash lamp). Pre-patterning the donor substrate can in fact be carried out in several ways, through which the formation of complex patterns of donor material on the donor substrate can be achieved.

By providing a pattern of donor material on the donor substrate, the use of patterned light, i.e. patterning of light by means of a mask, is not required anymore for transferring a pattern on the receiving surface. In this way, the use of such light patterning masks can be avoided. Such a light patterning mask is not customizable and typically expensive, while according to the current disclosure, it can be easier and/or cheaper for changing and/or modifying the pattern of donor material which needs to be applied on a receiving surface, i.e. customizability of the pattern to be created can be improved significantly while the fabrication costs can be reduced. Replacement of a light patterning mask in the patterning arrangement is often not easy. A mask needs to be replaced, or alternatively a plurality of masks need to be employed, when the pattern to be created is changed. On the other hand, replacing a patterned donor substrate can be easier and more cost-effective. Consequently, patterning of donor material on a donor substrate can offer many advantages over patterning of light coming from a light source.

When employing a light patterning mask so as to obtain a mask-specific pattern of donor material on a receiving surface, material is spread across an entire surface on the donor substrate and the mask is utilized so as to allow transferring only a portion of the donor material on the donor substrate. Consequently, typically only a fraction of the material is actually transferred and thus used during the process. According to the current disclosure described herein, a (pre-)patterned donor substrate is employed which comprises a pattern of donor material, wherein the pattern is formed by one or more occupied regions of the donor substrate with donor material attached thereto and one or more unoccupied regions of the donor substrate free of donor material. In this way, it can be avoided that material is applied uniformly completely covering the donor substrate. The donor substrate can be already patterned and the donor material does not have to be applied everywhere, but is rather introduced on selected locations in the one or more occupied regions of the donor substrate. Therefore, resulting waste products can be reduced and/or the need of recycling of used donor substrates can be avoided.

Advantageously, the method enables transfer of donor material on the donor substrate onto the receiving surface without splashes, satellite droplets, and/or spreading.

Optionally, the pattern of donor material on the donor substrate is transferred as a whole by illumination of the light pulse, wherein the illumination covers both the occupied and unoccupied regions. The light pulse can be arranged for providing direct illumination. A homogenous illumination of the donor substrate can be employed for transferring donor material on the donor substrate.

In an advantageous embodiment, the one or more occupied regions form non-contiguous discrete islands of donor material on the donor substrate.

In an advantageous embodiment, the one or more unoccupied regions are contiguous with and surrounding one or more occupied regions on the donor substrate.

In an advantageous embodiment, the light pulse impinges on the one or more occupied regions and the one or more unoccupied regions of the donor substrate. Advantageously, the light pulse can impinge simultaneously on both the occupied and unoccupied regions, since in this case light patterning is not required for transferring a specific pattern to the receiving surface. Therefore, no additional light blocking or filtering means, such as light patterning masks, may be required for transferring a pattern of donor material from the donor substrate onto the receiving substrate.

In an advantageous embodiment, the pattern of donor material corresponds to a patterned structure to be created on the receiving surface. The pattern to be created on the receiving surface can be patterned on the donor substrate such as to enable direct transfer of said pattern onto the receiving surface as a result of the light pulse provided by the light source.

In an advantageous embodiment, the pattern of donor material is different compared to the patterned structure to be created on the receiving surface. The pattern on the receiving surface can be distorted, transformed or deformed with respect to the pattern on the donor substrate. The pattern on the donor substrate can therefore be adapted so as to take into account the deformation as a result of the transfer from the donor substrate to the receiving surface. Inverse techniques can be applied for determining such adaptation of the pattern. Other solutions are also possible, such as empirical models, experiments, simulations, etc. A combination of techniques can also be employed. Using the adapted pattern on the donor substrate can then reduce or eliminate warping or deformation effects as a result of the transfer of donor material. Also, in an embodiment, transfer of donor material can be carried out using successive transfer steps in which a pattern is transferred from successive donor substrates to a same receiving surface.

In an advantageous embodiment, the donor material is released from the donor substrate to transfer contactlessly towards the receiving surface by means of the light pulse. As a result, a contactless method can be obtained for quickly transferring large patterns of donor material at once, by means of a single light pulse.

In one embodiment, the donor substrate 1 comprises an optional releasing layer between a transparent substrate 1 and the layer of donor material 1a. In a further embodiment, the releasing layer 2 reacts under influence of the light 6 for releasing the donor material 1a from the donor substrate 1. For example, the release may be effected by a sudden rise in heat and resulting expansion of the release layer material. For example, a shock wave may travel through the material and cause the formation of a droplet. Also other mechanisms of release can be envisaged either with or without a release layer.

In an advantageous embodiment, the donor substrate comprises a plurality of separate portions of donor material which are separated at least by an area without donor material.

In an advantageous embodiment, the separate portions form a structured pattern of donor material on the donor substrate. In an advantageous embodiment, the separate portions are homogeneously sized. The size can be quantified by a surface area.

The pattern of donor material to be created may comprise a plurality of pattern areas having different sizes corresponding to different sizes of areas of the patterned structure to be formed (cf. structured pattern). The pattern of donor material on the donor substrate can be divided into separate homogeneously sized portions spaced apart from each other (gap between two adjacent separate homogeneously sized portions), wherein a plurality of neighboring separate homogenously sized portions are arranged to form one pattern area of the plurality of pattern areas.

In an advantageous embodiment, the donor substrate is spaced apart from the receiving surface. In another or further embodiment, the donor material is arranged to face the receiving surface. The donor material on the donor substrate can form one or more protrusions facing the receiving surface. In one embodiment, the donor material is arranged on a face (side) of the donor substrate between the donor substrate and the acceptor substrate, i.e. facing away from the light source. The donor substrate can be transparent to the light, i.e. the light can travel through the donor substrate until it impinges the donor material on one face thereof. By the light impinging the donor material, said material can be released from the donor substrate and launched towards the acceptor substrate where it can build up the patterned structure. The donor substrate is thus arranged such that the light pulse can cause the donor material to be transferred to the receiving surface. In one embodiment, a distance between the donor substrate and receiving substrate is more than 25 µm, preferably more than 100 µm. By having sufficient distance, the donor material can be further heated by the light while in transit between the substrates. In a further embodiment, a distance between the donor substrate and receiving surface is less than 2 mm, preferably less than 1 mm, more preferably less than 500 µm. Having a smaller distance may improve accuracy of the placement of donor material. In one embodiment, the donor substrate comprises a transparent substrate with a layer of donor material arranged thereon. In a further embodiment, the donor substrate comprises a releasing layer between the transparent substrate and the layer of donor material, wherein the releasing layer reacts under influence of the light for releasing the donor material from the donor substrate.

In an advantageous embodiment, the donor substrate is produced by providing donor material on the one or more occupied regions while keeping the one or more unoccupied regions free of donor material. A specific pattern of donor material can be formed on the donor substrate by selectively providing donor material on the one or more occupied regions, wherein the specific pattern on the donor substrate is suitable for obtaining a desired pattern on the receiving surface after transfer. Furthermore, it may also be possible to obtain a specific pattern by removal of portions of donor material on the donor substrate. For example, a donor substrate with a uniform distribution of donor material on its surface can be processed for removing donor material on specific locations so as to obtain a specific pattern suitable for forming a desired pattern on the receiving surface after transfer.

In an advantageous embodiment, the donor substrate is produced by: dividing at least a part of a pattern of donor material to be created on the receiving surface into a plurality of separate discrete sub-portions; and providing donor material on the separate discrete sub-portions on the donor substrate. In some cases, the transfer of donor material from the donor substrate onto the receiving substrate by the light pulse can be difficult to control because the transfer behavior can be dependent on a size of the different areas of donor material that are transferred. For example, the energy needed to release an area of donor material may depend on the shear forces on the donor material to be transferred, which can be different for different area sizes. Furthermore, when a large area of material is transferred at once, the area may break up into debris while transferring which can lead to unpredictable patterning behavior. Advantageously, by dividing the at least a part of a pattern or an area of donor material into separate discrete sub-portions, the reaction of the donor material to the light pulse impinging on it can be more uniform and predictable.

In an advantageous embodiment, the spacing between the sub-portions is sufficiently small such that a non-subdivided pattern of donor material is obtained on the receiving surface after transfer of the subdivided pattern of donor material onto the donor substrate. A pattern of donor material to be created on the receiving surface, having a plurality of pattern areas, can be first subdivided into a smaller set of sub-portions before applying the pattern on the donor substrate. For instance, a block-shaped pattern area can be subdivided into four block-shaped sub-portions spaced apart from each other, wherein the obtained pattern on the receiving surface after transfer by means of the light pulse comprises the block-shaped pattern area without the subdivision into the four block-shaped sub-portions. Other shapes can also be employed, such as rounded shapes, circles, quadrangles, polygons, pentagons, hexagons, octagons, etc.

In an advantageous embodiment, the sizes of pattern areas of the pattern of donor material to be created on the receiving surface are identified in one or more dimensions, wherein a pattern area is only subdivided into a plurality of separate discrete sub-portions if the identified size of the pattern area in the one or more dimensions exceeds a threshold value for the one or more dimensions, respectively. A maximum dimension or size (e.g. surface area) for pattern areas can be defined so that a pattern area is subdivided into a plurality of separate discrete sub-portions if a dimension or size of said pattern area exceeds the defined maximum dimension or size. By discretizing only larger pattern areas of a pattern of donor material to be created on the receiving surface, unnecessary changes to the pattern can be avoided (e.g. in smaller areas). In this way, only pattern areas are selected for being subdivided into sub-portions when a certain dimension or size exceeds a maximum or threshold value for the dimension or size, respectively.

In an advantageous embodiment, at least some separate discrete sub-portions have different sizes. For example, complex shapes, sharp edges, sudden transitions may require smaller sizes, while for other portions homogeneously sized sub-portions can be used.

In an advantageous embodiment, the separate discrete sub-portions are homogeneously sized. In this way, each sub-portion has a same size, such that each droplet of donor material to be released can be of the same size and volume and the transfer characteristic can be more predictable. Furthermore, a spacing in between the sub-portions can ensure that the resulting droplets are also separate and do not influence each other while in transit, thus further improving the predictability of the transfer characteristic. Accordingly, the material can be released from the donor substrate in the form of separate homogenously sized droplets. The well defined and separated droplets can merge together when colliding with the receiving substrate to form larger structures. The improved control over the transfer of a large number of droplets at once thus can provide a fast and contactless patterning of a large area structure on a substrate.

In an embodiment, the pattern to be created on the receiving surface comprises a plurality of pattern areas having different sizes. The pattern of donor material applied on the donor substrate depends on the pattern of donor material which needs to be formed on the receiving substrate as a result of the release and transfer of donor material from the donor substrate onto the receiving substrate. The pattern of donor material on the donor substrate and the pattern of donor material on the receiving substrate can substantially correspond to each other. However, said patterns can also be different in some sense depending on the desired pattern, the size of the pattern areas, non-planar shape of the receiving substrate with respect to the donor substrate, etc. By dividing the pattern on the donor substrate into separate sub-portions or pixels (e.g. homogeneously sized pixels), and applying such a pattern on the donor substrate, more control can be obtained for the transfer of the donor material to the receiving surface. A plurality of sub-portions or pixels can thus be arranged to form one pattern area of the plurality of differently sized pattern areas. For example, a pixelated donor material pattern can be produced by receiving a regular donor material pattern comprising a plurality of pattern areas having different sizes corresponding to differently sized circuit elements to be formed and dividing the pattern areas into a plurality of separate homogeneously sized pixels. Alternative or in addition to dividing the donor material pattern itself into pixels, the donor material pattern divided into pixels or sub-portions can be obtained by removing material on an initial donor substrate. Carving or similar techniques can also be employed.

In an advantageous embodiment, the homogeneously sized portions form non-contiguous discrete portions of donor material on the donor substrate. By homogeneously distancing the sub-portions pixelization can be obtained such that corresponding droplets of donor material can be deposited at homogeneous distances onto the receiving surface. When the transferred homogenous droplets arrive at the receiving surface, they may evenly spread on the substrate and thereby connect to neighboring transferred droplets. Accordingly, a large area interconnecting patterned structure can be formed by the separate droplets connecting to each other. Typically, such interconnecting of neighboring droplets can be achieved by providing a suitably small separation distance between neighboring sub-portions, for example related to a size of the beams, layer thickness of the donor material, viscosity of the donor material, and/or transfer velocity of the droplets. On the other hand, the separation distance is preferably large enough to allow the separate transfer of the droplets. Typically it is found advantageous to provide a separation distance between neighboring sub-portions on the order of a sub-portion size or smaller, e.g. between 20-200% a size of the sub-portion, preferably between 50-150%, even more preferably between 50-100%. When a pattern is first pixelated before applying it on the donor substrate, a pixel size and distance can be chosen such that a proper isolated droplet is ejected from the donor substrate.

When the donor material thickness is too large, shear forces may hinder the donor material to be properly released from the donor substrate. On the other hand, when a single island of donor material on the donor substrate is too large, the area of donor material that is transferred may break up.

Providing a pattern on a donor substrate can be achieved mechanically and/or chemically. For example, by utilizing mechanical means, trenches can be arranged on a surface of the donor substrate, wherein the trenches can be filled up with donor material. The trenches can also be made by other mechanical means such as embossing tools, scratching tools, carving tools, etc. Other techniques can also be utilized for obtaining indentations or trenches. For example, a laser beam can be used for creating trenches on the donor substrate. Using mechanical means is typically relatively easy and cost-effective, but the results can be permanent. It is also possible to use mechanical means for putting donor material on a donor substrate and scraping off excess material where necessary so as to form a pattern on the donor substrate. Furthermore, patterning can also be achieved "chemically" e.g. by creating hydrophobic and/or hydrophilic regions on the donor substrate. Patterning using "mechanical" and "chemical" means can be different in the sense that mechanical is permanent, while chemical may be temporary (e.g. chemical for holding donor material is removable) and/or adaptable. Using chemical patterning means can therefore improve the customizability.

Optionally, a mesh is employed for obtaining a meshed light pattern directed to the donor substrate so as to divide one or more material portions on the donor substrate into smaller sub-portions when transferred onto the receiving surface. The mesh can be arranged between the light source and the donor substrate. The mesh can be a mask configured for partially passing light so as to obtain a meshed light pattern.

In an advantageous embodiment, pixelated mask is employed in combination with a non-pixelated pattern on the donor substrate. In this way, a mask can be employed for pixelization or sub-division of pattern areas into one or more sub-portions by at least partly blocking the light pulse from reaching certain portions of the substrate, resulting in a selective irradiation of the donor substrate. In this way, the mask or mesh can be independent of the pattern of donor material on the donor substrate (e.g. simple raster defining maximum donor droplet size). The mesh can be employed for enabling the pattern areas to be divided into smaller pieces or sub-portions. In this way, a pixelated pattern of donor material defining maximum donor droplet size can be obtained, wherein the complexity of the system can be significantly reduced. The mesh can have a resolution in which the size of the sub-portions and/or the distance between adjacent sub-portions can be defined. Therefore, a mesh can be employed for a plurality of donor substrates having different patterns of donor material. Many types of meshes can be employed, e.g. rectangular, triangular, polygonal, etc.

Optionally, the discrete portions of the donor substrate comprising donor material are obtained at least in part by means of indentations arranged on the donor substrate, wherein the indentations are arranged for holding donor material. The donor material can be a solid material or a fluid, such as a viscous material. Examples of donor material are conductive pastes, heat bonding materials, solders, glues, etc. In case of a donor material having a high viscosity, mechanical means such as indentations and/or trenches can be beneficial for holding the donor material on the donor substrate. The indentations or trenches can be filled up with donor material. Such (mechanical) indentations or trenches can be considered as wells on a donor substrate surface in which donor material can collect and can be particularly beneficial for holding highly viscous donor materials.

In an advantageous embodiment, a combination of both mechanical and chemical means are employed for arranging the occupied regions for holding donor material. For low viscous materials, both mechanical and chemical means can be advantageous.

In an advantageous embodiment, an indentation is formed between two protrusions arranged on a surface of the donor substrate. In this way, wells or channels can be formed in which donor material can be collected for forming a pattern on the donor substrate.

In an advantageous embodiment, the indentations are formed by laser scribing. In this way, topology patterning of the donor substrate can be achieved for creating a desired pattern in a surface of the donor substrate. For instance, trenches can be laser scribed around defined areas. Donor material can then be dispensed onto the defined areas. With a single light pulse of a light source, material from the donor substrate can then be transferred to the receiving surface. Laser scribing allows for a low-cost production of re-usable donor substrate. In a similar fashion also channels, wells, indentations, etc. can be made on a donor substrate surface.

In an advantageous embodiment, the indentations are formed by embossing. An embossing unit comprising a pattern template can be employed for embossing the donor substrate. In this way, it is possible to quickly and efficiently modify a surface of the donor substrate for forming mechanical structures such as indentations, wells, channels, protrusions, etc., which can be arranged for holding donor material on the one or more occupied regions of the donor substrate. Advantageously, embossing is also compatible with roll-to-roll processing and can provide a quick and effective way of applying a specific pattern on a substrate.

Optionally, the method further comprises treating at least a part of a surface of the donor substrate so as to change the adhesiveness between said surface of the donor substrate and donor material.

A donor substrate can be obtained using mechanical and/or chemical means for forming the occupied regions which are arranged for holding donor material and unoccupied regions which are arranged for staying free of donor material, wherein a pattern of donor material is obtained by providing donor material on the occupied regions while keeping the unoccupied regions substantially free of donor material. The occupied regions can be formed or enhanced by mechanical trenches, discrete chemical hydrophilic regions, etc. The donor material can be applied on the template in a cost-effective and easy way. For example, a donor substrate comprising indentations for holding donor material can be further treated so as to change the adhesiveness between said surface of the donor substrate and donor material. In this way, donor material may more easily attach to the provided indentations on said donor substrate surface.

Optionally, the discrete portions of the donor substrate comprising donor material are at least in part obtained by a donor substrate arranged such that the relative adhesiveness between the donor material and the donor substrate is higher at the one or more occupied regions of the donor substrate than at the one or more unoccupied regions of the donor substrate.

A surface of the donor substrate can be processed anchor treated, e.g. chemically using a chemical, such that specific regions are created on the donor substrate having different relative adhesiveness with respect to the donor material. In an advantageous embodiment, such chemical manipulation of the adhesiveness properties of regions on the donor substrate is not permanent. For instance, the surface can be cleansed so that other configurations can be obtained by re-treating the surface. Therefore, the donor substrate adapted by employing chemical means can be re-used and modified, if necessary. Treating of the surface can in fact be achieved in many ways. For example, a suitable chemical can be applied using a monolayer, oxidization, printer, a mask, etc. A surface can be made hydrophobic everywhere and on top of it made hydrophilic in some specific regions, i.e. in the occupied regions, so that material can be easily applied on the specific locations of the donor substrate. The donor material will tend to attach to the occupied regions having hydrophilic properties and avoid unoccupied regions having hydrophilic properties. This can be achieved using a system which can be controlled digitally, so that the patterning process can be simplified, accelerated and made more accurate, enabling fast and precise production of new prototype designs.

The change of adhesiveness, which can be seen as an attraction between two objects or surfaces, can be achieved in different ways. For example, a surface of the donor substrate can be at least partially coated, chemically treated so as to obtain relative hydrophobic and hydrophilic regions.

In an advantageous embodiment, the donor substrate comprises at least one alignment marker such as to provide alignment when applying donor material on the donor substrate.

In an advantageous embodiment, the alignment marker is formed by at least one of the one or more occupied regions of the donor substrate.

Optionally, the donor substrate comprises a pattern of cells defining boundaries for containing the donor material inside the boundaries, wherein the pattern of donor material is formed by selectively occupying a predefined subset of the cells. In this way, the donor substrate can comprise a plurality of predefined cells arranged for being selectively occupiable by donor material for forming a pattern on the donor substrate obtained by selected occupied cells.

Optionally, the cells are disposed on the donor substrate in an array of rows and/or columns. The plurality of predefined cells of the donor substrate can be arranged in a cell layout in which the cells are arrayed in rows and/or columns, wherein a pattern of donor material on the donor substrate is configurable by selectively providing donor material on one or more cells.

A cell can be formed by a confined area on the donor substrate. The donor substrate can be selectively occupied with donor material on one or more of the predefined cells so as to form a pattern of donor material on the donor substrate. In this way, the pattern or arrangement of the one or more occupied regions can be configurable, enabling multiple possible patterns which can be obtained by one donor substrate. In this way only selected cells can be reserved for having donor material, while other cells can be reserved to be free of donor material such that a specific pattern can be formed. The donor substrate can be recycled by replacing donor material in any empty cells in the donor substrate.

In an advantageous embodiment, the array comprises rows and columns forming a matrix of predefined cells on the substrate which are arranged for being selectively occupied by donor material.

In an advantageous embodiment, the plurality of predefined cells have a same size and/or shape. Thus, the plurality of predefined cells can be structured. A resolution can be defined depending on the size of the plurality of predefined cells and mutual distance of an area to an adjacent area. A higher resolution may result in more accurate patterning, while a lower resolution may result in easier patterning of the donor substrate.

In an advantageous embodiment, the plurality of predefined cells comprises a first cell and a second cell having different sizes and/or shapes relative to each other.

Arrayed cells can be selectively occupied by donor material, thereby enabling a configurable arrangement of the occupied regions having donor material, i.e. defining a specific pattern. Therefore, the pattern can be personalized depending on the application and/or on the desired pattern which needs to be transferred onto the receiving surface.

In an advantageous embodiment, the cells are formed by slots, which can be arranged in rows and columns. The slots can have sidewalls between which donor material can be disposed.

In an advantageous embodiment, the cells are formed by channels defining a slicing path, the channels having sidewalls between which donor material can be disposed.

In an embodiment, the predefined cells are formed by slots which can selectively be filled with donor material. A matrix of slots can be arranged on the donor substrate, providing a configurable arrangement of slots. The plurality of predefined cells or predefined slots can be arranged for being occupiable by donor material in various combinations to thereby provide a configurable pattern on the donor substrate, which can result in a (desired) selected pattern on the receiving surface when transferred from the donor substrate by means of the light pulse. Consequently, the donor substrate can be employed for a large number of pattern configurations while applying the pattern of donor material on the donor substrate can be made easier.

The configurable array of cells can have many size, shapes and forms. For example, the cells can be rounded, polygonal, triangular, square, rectangular, trapezoidal, round, circular, elliptical, honeycomb-shaped, quadrangular, pentagonal, hexagonal, octagonal, etc. Other shapes are also possible. Furthermore, the cells can have structural features or be formed as a result of properties of the surface of the donor substrate (e.g. chemical, physical, etc.). In case of structural features, for example, an indentation can be formed in the surface for being occupiable by donor material. In case of surface properties (e.g. chemical), the surface of the cell can be arranged such that the relative adhesiveness between the donor material and the donor substrate is higher in the cell compared to outside the cell. A combination of structural features and surface properties can also be employed.

Optionally, at least one portion of the receiving surface, on which the donor material is applied, is curved.

A challenge experienced in the process of applying circuit patterns directly onto structural components is that such structural components (i.e. receiving surface) are often three-dimensional or non-planar. The method according to the current disclosure enables the application of a circuit pattern onto a non-planar receiving surface. Furthermore, solder paste can be dispensed onto discrete locations on the circuit pattern to form electrically conductive solder joints once the circuit pattern has been applied to the non-planar receiving surface. Solder can be applied at a plurality of discrete locations on the non-planar surface.

In case the donor substrate is spaced apart with respect to the receiving surface, a contactless transfer of donor material can be achieved, which can make transfer of donor material on a non-planar or curved portion of the receiving surface easier. In an example donor material of a desired pattern is transferred from a planar donor substrate to a non-planar receiving surface.

In an advantageous embodiment, the receiving surface has a non-planar three-dimensional shape.

Optionally, the receiving surface is flexible and/or stretchable.

In an advantageous embodiment, the receiving surface is reversibly stretchable. For example stretching along a dimension by a factor of four or less results in a reversible deformation. As a result of an elastic deformation, damage and/or deterioration to the receiving surface (cf. plastic deformation; irreversible deformation) can be prevented.

In an advantageous embodiment, the receiving surface is at least partially deformed and/or stretched to a non-planar shape on the moment of transfer of donor material from the donor substrate to the receiving surface. Such deformed and/or stretched state of the receiving surface can be more appropriate for transferring donor material from the donor substrate onto the receiving surface.

In an advantageous embodiment, the receiving surface is released after transfer of donor material in its deformed and/or stretched form.

For this purpose, a deforming unit can be arranged for deforming at least a part of the receiving surface into a deformed and/or stretched form, wherein after deformation the receiving surface can be released. After being stretched, the receiving surface can assume its original shape again when released by the deforming unit.

In an advantageous embodiment, the receiving surface is a substrate.

Optionally, a mask is arranged over a portion of the donor substrate, between the light source and the donor substrate, for at least partly blocking the light pulse from reaching at least a portion of the donor substrate.

It is thus not required to selectively irradiate the donor substrate by means of a mask for transferring a pattern of donor material to the receiving surface. However, a mask can be used in combination with a donor substrate having a pattern of donor material, i.e. comprising occupied and unoccupied regions, so as to improve patterning of the receiving surface. In an advantageous embodiment, the mask is not pattern-specific. A mask can be employed for pixelization or sub-division of pattern areas into one or more sub-portions by at least partly blocking the light pulse from reaching certain portions of the substrate, resulting in a selective irradiation of the donor substrate. In an advantageous embodiment, a mask comprises a grid and/or a mesh for enabling the pattern areas to be divided into smaller pieces or sub-portions. In this way, the complexity of the system can be significantly reduced. The grid mask can have a resolution in which the size of the sub-portions and/or the distance between adjacent sub-portions can be defined. Therefore, a grid mask can be employed for a plurality of donor substrates having different patterns of donor material. Many types of grids and meshes can be employed, e.g. rectangular, triangular, polygonal, etc.

Optionally, the donor material is a bonding material. A bonding material can be e.g. a heat bonding material, a solder, an adhesive, a glue, etc. Different materials can be used on a single donor substrate.

Optionally, the bonding material is employed for bonding a chip to a substrate by means of thermal bonding. In this way, a component such as a chip can be bonded on the receiving surface by means of an applied pattern of donor material on the receiving surface.

Optionally, the donor material on the donor substrate is patterned to match a pre-existing pattern on the receiving surface, wherein the donor material is transferred onto the pre-existing pattern. In an advantageous embodiment, the pre-existing pattern is a pattern of electrical terminals and the donor material is an electrically conductive material, wherein the electrically conductive donor material is transferred onto the electrical terminals to form electrical connections.

In an advantageous embodiment, the receiving substrate is a substrate comprising a circuit and a plurality of electrical contact points, wherein the bonding material is a solder, wherein a pattern of solder on the donor substrate is transferred onto the receiving substrate such as to form a pattern of solder points. In an example, the solder points are first identified prior to applying the required solder pattern on the receiving substrate.

Optionally, the method is carried out using roll-to-roll (R2R) processing. As a result of the light pulse directed to the donor substrate, a relatively large area of illumination from a light source (e.g. flash lamp) may cancel out the restrictions regarding alignment of the light source with the respect to specific locations of the donor substrate having donor material attached thereto, and thus makes the process compatible with R2R processes. By using a R2R setting with flexible receiving substrates higher processing speeds can be achieved.

In an advantageous embodiment, the R2R processing further comprises a step of embossing a donor substrate with a roll.

In accordance with a second aspect, the invention provides a system for applying a patterned structure on a surface. The system comprises a donor substrate comprising donor material, a receiving surface, and a light source arranged for providing a light pulse directed to the donor substrate. The donor substrate is arranged between the light source and the receiving surface. The light pulse is configured to cause the donor material to be transferred from the donor substrate onto the receiving surface. The donor material forms a pattern of material portions at one or more occupied regions of the donor substrate with the donor material attached thereto and one or more unoccupied regions of the donor substrate free of the donor material. The unoccupied regions are interspersed between the occupied regions. The pattern of donor material on the donor substrate is transferred as a whole by the light pulse so as to form a resulting pattern of donor material on the receiving surface.

The light source can be a flash lamp, e.g. a (pulsed) xenon flash lamp or any other light source which is capable of transferring a whole pattern structure at once by providing a light pulse. For example, in one embodiment, a high intensity pulsed xenon flash lamp is used to transfer patterned inks from a donor substrate to a receiving surface. High powered laser pulses (e.g. Laser Induced Forward Transfer—LIFT) are also able to expel donor material from a donor substrate to a receiving surface, wherein an entire pattern can be transferred simultaneously. To properly obtain transfer material with a conventional light source a short duration and high power light source is desired.

In accordance with another aspect, the invention provides a computer program product downloadable from a communication network and/or stored on a computer-readable and/or microprocessor-executable medium, comprising program code instructions that, when executed by a photonic heat bonding system including a processor, causes the system to perform a method as described herein.

The invention further relates to a substrate comprising a patterned structure obtained according to the method of the invention.

The patterned structure can for example comprise conductive tracks and/or bonding points made out of a heat bonding material (e.g. solder or adhesive material).

The method for transferring pattern of donor material can also be used as a method for soldering a component (e.g. chip) to a substrate. For example, electrical connections can be made by first determining where the electrical connections are required, then applying the required pattern on a donor substrate and then transfer the pattern to a receiving substrate.

BRIEF DESCRIPTION OF THE DRAWINGS

The invention will further be elucidated by description of some specific embodiments thereof, making reference to the attached drawings. The exemplary embodiments are given by way of non-limitative illustration. The detailed description provides examples of possible implementations of the invention, but is not to be regarded as describing the only embodiments falling under the scope. The scope of the invention is defined in the claims, and the description is to be regarded as illustrative without being restrictive on the invention.

In the drawings:

FIG. 2a and FIG. 2b schematically illustrate an embodiment of the present invention;

FIG. 4a and FIG. 4b schematically illustrate an embodiment of the present invention;

FIG. 5 schematically illustrates donor substrates of the present invention;

FIG. 7 schematically illustrates an embodiment of the present invention;

FIG. 8 schematically illustrates an embodiment of the present invention; and

FIG. 9 schematically illustrates an embodiment of the present invention.

DETAILED DESCRIPTION

Figure 1A:
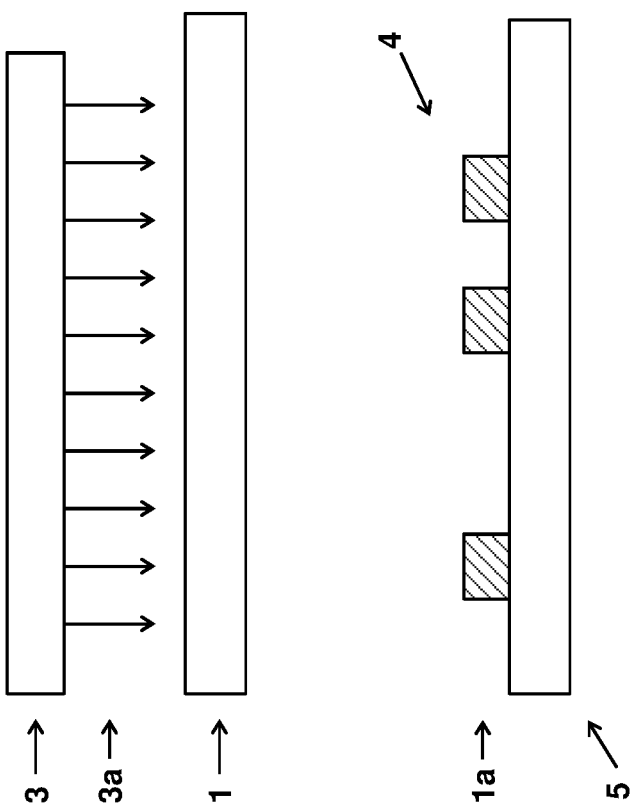
FIG. 1a and FIG. 1b schematically illustrate an embodiment of the present invention.
Figure 1B:
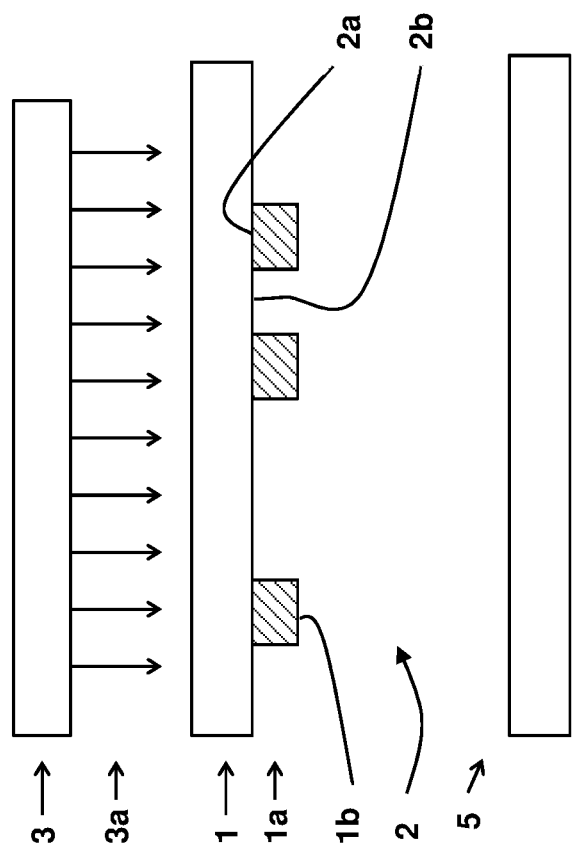

FIG. 1a and FIG. 1b show a schematic illustration of a method for applying a patterned structure on a surface. A donor substrate 1 comprising a donor material 1a is provided between a light source 3 and a receiving surface 5. By means of the light source 3 a light pulse 3a directed to the donor substrate 1. The light pulse 3a is configured to cause the donor material 1a to be transferred from the donor substrate 1 onto the receiving surface 5. The donor material 1a forms a pattern 2 of material portions 1b at one or more occupied regions 2a of the donor substrate 1 with the donor material 1a attached thereto and one or more unoccupied regions 2b of the donor substrate 1 free of the donor material 1a. The unoccupied regions 2b are interspersed between the occupied regions 2a, wherein the pattern 2 of donor material 1a on the donor substrate 1 is transferred as a whole by the light pulse 3a so as to form a resulting pattern 4 of donor material 1a on the receiving surface 5.

FIG. 1a shows the donor material 1a attached to the donor substrate 1, prior to transfer of said donor material 1a by means of the light pulse 3a onto the receiving surface 5. FIG. 1b shows a resulting pattern 4 of donor material 1a formed on the receiving surface 5 transferred by means of the light pulse 3a. In this example, the donor substrate 1 and the donor material 1a attached thereto prior to the transfer are both spaced apart from the receiving surface 5, resulting in a contactless transfer of said donor material 1a.

FIG. 2a and FIG. 2b show examples of a donor substrate 1 comprising a pattern 2. A pattern can have material portions 1b connected with other material portions 1b, and/or separated material portions 1b which are not connected to other material portions 1b. In the example of FIG. 2b the material portions 1b include a pattern 2 repeating in a predictable manner, namely a pattern 2 comprising a group of rectangular material portions 1b which are arranged in a structured fashion.

Figure 3B:
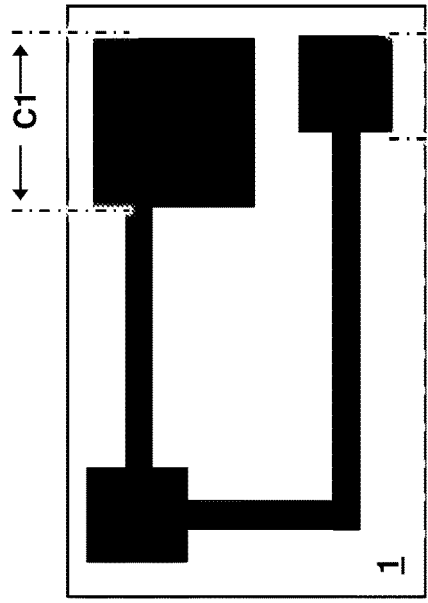
FIG. 3a, FIG. 3b and FIG. 3c schematically illustrate an embodiment of the present invention.
Figure 3C:
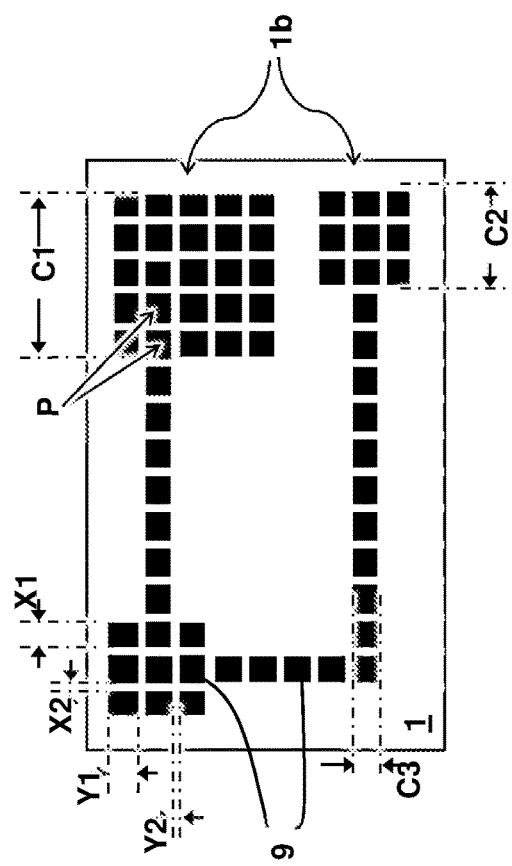
Figure 3A:
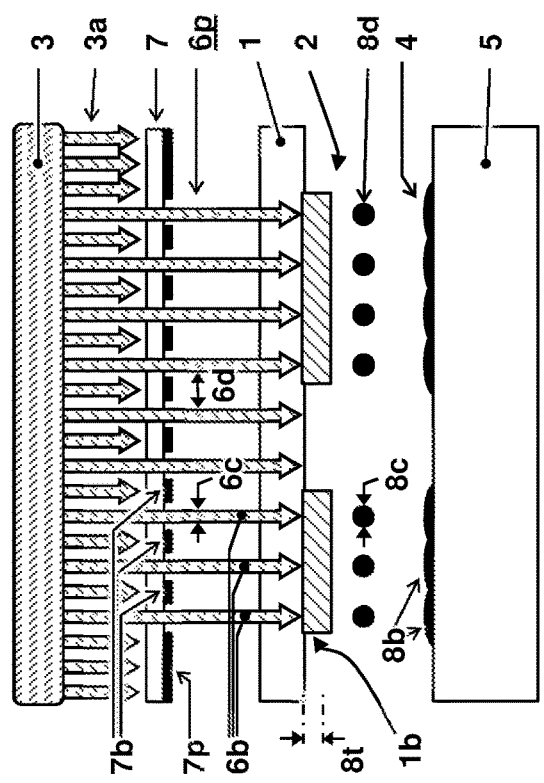

FIG. 3a shows an embodiment in which a mesh is employed for obtaining a meshed light pattern directed to the donor substrate 1 so as to divide one or more material portions 1b on the donor substrate 1 into smaller sub-portions 9 when transferred onto the receiving surface 5. In this example, the mesh is a mask arranged between the light source 3 and the donor substrate 1, wherein the mask 7 comprises a meshed mask pattern 7p for patterning light of the light pulse 3a emitted by the light source 3 impinging the donor substrate 1. The light pulse 3a emitted by the light source 3 is divided into separated homogeneous light beams for patterning material portions 1b into smaller sized sub-portions 9.

The patterned light 6p does not need to match the patterned structure to be created on the receiving surface 5. A generic mask can be employed so as to subdivide the material portions 1b, which may comprise relatively large continuous areas of donor material 1a as shown in FIG. 3b, into smaller sub-portions 9 as shown in FIG. 3c. Typically, in a circuit or corresponding pattern 2 on the donor substrate 1 such as shown, the material portions 1b may have different sizes C1, C2, C3, etc. When a material portion has a too large size, e.g. C1, then the a non-patterned light 6p, e.g. comprising a large continuous beam, would impinge the donor substrate 1, which may cause a large chunk of donor material to be released from the donor substrate 1 and transfer to the receiving surface 5. However, because the area is so large, it could break up while in transit leading to the formation of debris, which can form an irregular resulting pattern 4 on the receiving surface 5. Therefore, it can be advantageous to employ a mask or mesh for obtaining a patterned light, able to subdivide the material portions 1b on the donor substrate 1 into smaller sub-portions 9. The mask can be generic and configured independently with respect to the pattern 2 on the donor substrate 1.

FIG. 3a shows an embodiment where large areas of material portions 1b of a pattern 2 are subdivided using separated homogeneous light beams obtained by a mesh 7. The patterned light 6p impinging the donor substrate 1 causes the material portions 1b to be released from the donor substrate 1 and transfer to the receiving surface 5 to form the resulting pattern 4 of donor material 1a thereon. Advantageously, the patterned light 6p is divided into a plurality of separate homogeneously sized beams 6b simultaneously impinging the donor substrate 1. This causes the donor material 1a to be released from the donor substrate 1 in the form of separate homogeneously sized droplets 8d.

As described herein, preferably, the beams are homogeneously sized, i.e. they have approximately the same size, e.g. cross-section or (maximum) diameter of the beams. Preferably, all beam diameter sizes are within a margin of +/−30% of the mean beam diameter size, preferably within a margin of +/−20% or even +/−10%. The smaller the spread of beam sizes, the more homogeneous can be the resulting droplet sizes. Alternatively or in addition to the approximate equal beam sizes, preferably, the energy per beam is preferably also approximately equal, e.g. within 30% margin.

Preferably, neighboring beams 6b are homogeneously distanced 6d for depositing the droplets 8d of donor material 1a at homogeneous distances onto the receiving surface 5, wherein an interconnecting patterned structure or resulting pattern 4 is formed by the transferred droplets spreading on the receiving surface 5 and connecting to neighboring transferred droplets.

As described herein, preferably, the beams are homogeneously distanced, i.e. neighboring beams that are together forming a pattern have a distance between the beams that is within a margin of 30% of a mean distance, preferably within 20% or even 10%. The smaller the spread in distances, the more predictable can be the behavior of the transfer and subsequent spreading of the droplets on the substrate.

In one embodiment, a desired spreading and interconnecting is achieved by a separation distance 6d between neighboring beams that is between 50-150% a size 6c of the beams.

FIG. 3b shows a donor substrate with donor material 1a attached thereto, the donor material 1a forming a pattern 2 comprising a plurality of material portions 1b. FIG. 3c illustrates the sub-portions 9 being illuminated by the light pulse 3a as a result of the mask 7, wherein occupied regions on the donor substrata 1 having donor material 1a attached thereto and not being illuminated as a result of the patterned light are shown as gaps (white) between material portion 1b sub-portions 9 (black). In this way, the pattern 2 of donor material 1a on the donor substrate 1 as shown in FIG. 3b is subdivided into smaller pixels P by localized illumination of the sub-portions 9 obtained by the mask 7 as shown in FIG. 3c, wherein only the illuminated sub-portions 9 are transferred by the light pulse 3a. The light is patterned by a pattern area 7a divided into a plurality of separate homogeneously sized neighboring beams 6b which neighboring beams form an interconnected area of the patterned structure 4 on the receiving surface 5. In one embodiment, the resulting patterned structure or pattern 4 on the receiving surface is a circuit pattern comprising circuit parts having different dimensions. A separation distance X2 between pixels is preferably between 10-150% a size X1 of the pixels. Other pixel types, dimensions and configurations can also be employed. In an example (not shown), only one or more parts of the donor substrate 1 are pixelated by a mask. In another or further example, the light is divided into separate beams by a second mask (not shown). Many variations are possible. A mask 7 can be used as a generic pattern mesher, wherein depending on a desired (pixel) resolution a same generic mask can be employed for different donor substrates 1 having a different pattern 2.

In one embodiment, a desired droplet formation is achieved by a size 6c of beams 6b impinging the donor substrate 1 that is between 150-250% a layer thickness 8t of the donor material 1a on the donor substrate 1. Typically, a size, e.g. diameter 8c of the droplets 8d can be on the order of the size, e.g. diameter 6c of the beams 6b. This means that a size X1 of the pixels is preferably between 150-250% a layer thickness 8t of the donor material 1a.

As shown in FIG. 3c, the pixelated mask causes light of the light pulse to be patterned on the donor substrate 1 in a pattern comprising a plurality of separated pixels P for regulating a size of material released from the donor substrate by the light. In this way a desirable drop formation can be achieved as opposed to irregular and/or uncontrolled breakup of the donor layer.

In one embodiment, the pattern areas 7a are divided into pixels P by a grid 7b between the pixels. In one embodiment, each pixel has a pixel diameter smaller than 200 µm, preferably, smaller than 150 µm, more preferably smaller than 100 µm.

Preferably, the beams have first dimension and second dimensions X1, X2 that are approximately equal to provide a properly formed drop, e.g. the beam can be square or circular. Accordingly, in the mask pattern, the pixels P preferably have a first dimension X1 and a transverse second dimension Y1 which is approximately equal to the first dimension X1, e.g. within a margin of +/−20%. Other dimensions and configurations are also envisaged.

FIG. 4a shows an embodiment with a donor substrate 1 comprising a pattern of cells 10 defining boundaries 11 for containing the donor material inside the boundaries, wherein the pattern 2 of donor material 1a is formed by selectively occupying a predefined subset of the cells 10. FIG. 4b shows a resulting pattern 4 of donor material 1a on the receiving surface 5 obtained by transfer of donor material 1a present in the selectively occupied predefined subset of cells 10 (see FIG. 4a) from the donor substrata 1 onto the receiving surface 5 by means of a light pulse 4a. In this example, the cells 10 form circular boundaries 11. Other shapes, sizes and configurations (e.g. distance with respect to each other) are possible. A donor substrate comprising cells 10, which can be selectively occupied, can be easily re-used for obtaining a same or different resulting pattern 4 on the receiving surface 5.

FIG. 5 shows various donor substrates (FIGS. 5 (*a*)-(*f*)), comprising donor material 1a. The donor substrate 1 can be produced by selectively providing donor material 1a on the one or more occupied regions 2a while keeping the one or more unoccupied regions 2b free of donor material 1a so as to form a pattern 2 on the donor substrata 1. The pattern 2 can be configured to form a desired resulting pattern 4 on the receiving surface 5 after transfer. In the donor substrates illustrated in FIGS. 5 (*a*)-(*c*), the discrete portions of the donor substrate comprising donor material are obtained at least in part by means of indentations 12 arranged on the donor substrate 1, wherein the indentations 12 are arranged for holding donor material 1a. The indentations 12 or trenches 12 can be filled up with donor material 1a forming material portions 1b. Such indentations 12 can be considered as wells on a donor substrate surface in which donor material 1a can be held. In FIG. 5 (*b*), an indentation 12 is formed between protrusions 13 arranged on a surface of the donor substrate. In FIG. 5 (*c*) the indentations are formed as a result of laser scribing deforming the surface of the donor substrate. Donor material 1a may then be more easily applied and dispensed in the indentations 12. Many indentations shapes are possible for obtaining enhanced attachment of donor material to the donor substrate 1. The indentations 12 can also be formed by embossing. In FIG. 5 (*d*) the material portions 1b of donor material 1a on the donor substrate 1 are at least in part obtained by a donor substrate arranged such that the relative adhesiveness between the donor material and the donor substrate is higher at the one or more occupied regions 2*a* of the donor substrate 1 than at the one or more unoccupied regions 2*b* of the donor substrate 1. For this purpose, the surface of the donor substrate 1 can be processed and/or treated, e.g. chemically using a chemical, such that specific regions are created on the donor substrate having different relative adhesiveness with respect to the donor material 1*a*. In the example shown in FIG. 5 (*d*), the donor substrata 1 comprises zones 14 with enhanced adhesiveness with respect to the donor material 1*a*. In FIG. 5 (*e*), an additional layer 15 is applied on the substrata 1 having zones 14 with higher adhesiveness with respect to the donor material 1*a*, wherein advantageously donor material 1a is applied on the zones 14. FIG. 5 (*f*) shows a donor substrate 1 with its surface treated (e.g. oxidization) to obtain higher adhesiveness with respect to the donor material 1*a* in zone 14, on which donor material 1*a* is attached. The donor material 1*a* will tend to more easily attach to the zone 14 (higher adhesiveness) for forming the occupied regions on the donor substrata 1.

Figure 6:
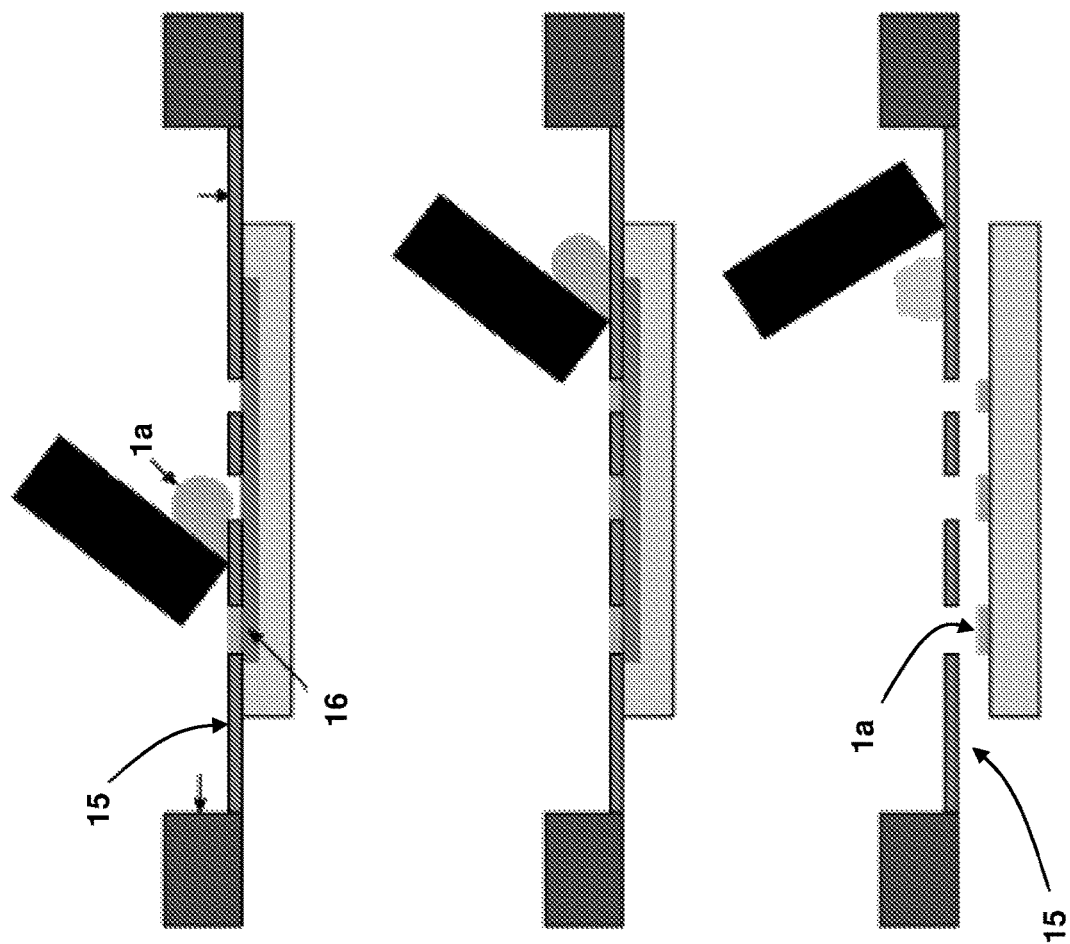
FIG. 6 schematically illustrates a donor substrate.

FIG. 6 shows a method for applying donor material 1*a* on a donor substrate 1, wherein a template 15 is used configured to form a pattern 2 on the donor substrate 1. The template 15 comprises indentations or trenches 16 and is brought in contact with the donor substrate. The trenches 16 are then filled with donor material 1*a*, after which the template 16 is removed so that the donor material 1*a* forming a pattern 2 can remain attached to the donor substrate 1.

FIG. 7 shows an embodiment wherein at least one portion of the receiving surface 5, on which the donor material 1*a* is applied, is curved and non-planar, forming a three-dimensional shape. Advantageously, the current invention can be employed for contact-free applying a resulting pattern 4 of donor material 1*a* on complex three-dimensional shaped substrates.

FIG. 8 shows an embodiment wherein the receiving surface 5 is curved and flexible. Prior to transferring the pattern 2 of donor material 1a on the donor substrate 1 onto the curved receiving surface 5, the receiving surface 5 is deformed by deforming means 18. The deforming means 18 can be arranged to clamping and deforming the receiving substrate 5 to a desired shape. The resulting pattern 4 on the receiving substrate 5, obtained by transfer of the pattern 2 of donor material 1*a* on the donor substrate 1, may be strongly influenced by the three-dimensional shape of the flexible receiving substrate 5, especially when the receiving surface is made out of a stretchable material. Therefore, the deforming means 18 can bring the receiving substrate 5 in a desired three-dimensional shape for transferring the pattern 2. In the shown example, the three-dimensional shape as a result of the deformation is non-planar. However, a planar shape is also possible. Other deformation shapes are also envisaged.

FIG. 9 illustrates an embodiment of a system 100 for providing a resulting pattern 4 or a patterned structure 4 on a receiving surface 5. The system 100 may be used to carry out the methods described herein. The system 100 comprises a light source 3 configured for providing a light pulse 3*a*. The system further comprises means 20*a* for providing a receiving surface 5 or substrate 5 for receiving the resulting pattern 4. Said means 20*a* may e.g. comprise a substrate transporter comprising rolls to produce the patterned structure in continuous manner, e.g. in a roll-to-roll or roll-to-sheet process. The system 100 further comprises means 20*b* for providing a donor substrate 1 comprising a donor material 1*a*, wherein the donor substrate 1 is arranged between the light source 3 and the receiving surface 5. The means 20*b* may e.g. comprise a transporter system for carrying the donor substrate 1. The system 100 may further comprise a mesh 7 (not shown here) e.g. arranged between the light source 3 and the donor substrate 1. In a preferred embodiment, the mesh comprises a mask pattern for patterning light 6 from the light source 3 impinging the donor substrate 1. The patterned light 6*p* can be divided into a plurality of separate homogeneously sized beams 6*b* simultaneously impinging the donor substrate 1 for causing the donor material 1*a* to be released from the donor substrate 1 in the form of separate homogeneously sized droplets 8*d*. Further, the system 100 may comprise means (not shown) for manipulating the donor substrate prior to transfer of the pattern 2, such that attachment of donor material 1*a* to the donor substrate 1 is made easier and/or is enhanced. For example, the system may comprise embossing means, (chemical surface) treating means, laser scribing means, etc., which are described above. In one embodiment, a velocity V of the transporters 20*a*, 20*b* and a pulse modulation of the light source 3 is controlled by a controller 25 such that a complete resulting pattern 4 is formed on the receiving substrate 5 by a single light pulse or pulse train. In other words, the transporters 20*a* and 20*b* move the donor and acceptor substrates at such a velocity that for each light pulse generated by the light source, the substrates have shifted to a new position to generate a next pattern.

In one embodiment, the present methods may combined with other steps, e.g. patterning of a chip bond pad; photonic sintering of conductive ink; placing solder bumps on a bond pad; photonic soldering after placing a chip; trench filling to avoid side leakage.

Generally, a pulse can be considered as a transient disturbance showing one or more relatively short (i.e. short-duration) bursts. The pulse shown in the embodiments comprises a relatively sharp leading edge quickly reaching a peak and then decaying more slowly. However, many variations of pulses are possible and can be employed for transferring a pattern of donor material on the donor substrate onto the receiving surface or receiving substrate. For example, also modulated pulses and/or a plurality of successive pulses can be employed instead of a single pulse comprising one peak only. A pulse can be split in a plurality of pulses. In some embodiments, a modulated light pulse and/or a light pulse train comprising a plurality of relative pulsed energy peaks (electromagnetic radiation) can be considered as "a light pulse", wherein the light pulse is arranged to momentarily increase the temperature of the donor material.

In one embodiment, the light comprises a modulated pulse wherein the modulation comprises a first and a second time interval wherein, in the first time interval, the modulated pulse has a first light intensity for releasing the donor material and wherein, in the second time interval, the modulated pulse has a second light intensity for drying, melting, and/or sintering the donor material while the donor material is in transit between the donor substrate and acceptor substrate. It is presently recognized that, a modulated pulse can be used to ablate, dry and sintering (melt) the transferred drop during flight. Because the drop does not undergo any heat sinking, it can be very efficiently heated to extremely high temperatures. The gap between the substrates and drop velocity may determine the time frame of the pulse. For example, depending on the distance, in one embodiment, the first time interval is less than 50 µs and the second time interval is more than 100 µs. Preferably, the first light intensity is higher than the second light intensity. By using a longer pulse, the additional energy (apart from the energy used for release of the donor material) can be used to efficiently heat the transferred drop.

As used herein, the term "substrate" has it usual meaning in materials science as an object comprising a surface on which processing is conducted. The substrate can be suitable for manufacturing electronics thereon, e.g. integrated circuitry. Processing may comprise fabrication of electronic structures on a substrate in one or more processing steps, e.g. layer deposition, exposure, curing, etcetera. In a typical semi-conductor manufacturing process, the substrate may be a silicon wafer. In the production of flexible electronics, the substrate typically comprises a foil. The term "foil" refers to a sheet comprising one or more layers of material. Preferably, the foil is flexible such that it can be used in a roll-to-roll (R2R) or roll to sheet (R2S) manufacturing process. For such purpose, a foil may be considered flexible if it can be rolled or bent over a radius of curvature of 50 cm or less, e.g. 12 cm, without losing its essential functionality, e.g. an electronic functionality. Alternatively, or in conjunction a foil may be considered flexible if it has a flexural rigidity smaller than 500 Pa·m^3.

Herein, the invention is described with reference to specific examples of embodiments of the invention. It will, however, be evident that various modifications and changes may be made therein, without departing from the scope which is defined by the claims. For the purpose of clarity and a concise description, features are described herein as part of the same or separate embodiments, however, it will be appreciated that the scope of the invention may include embodiments having combinations of all or some of the features described. Also alternative ways may be envisaged by those skilled in the art having the benefit of the present disclosure for achieving a similar function and result. E.g. the donor substrate may be combined or split up into one or more alternative components. The various elements of the embodiments as discussed and shown offer certain advantages, such as reducing the risk of damaging components, reducing costs, improving production, improving efficiency, etc. Of course, it is to be appreciated that any one of the above embodiments or processes may be combined with one or more other embodiments or processes to provide even further improvements in finding and matching designs and advantages. It is appreciated that this disclosure offers particular advantages to soldering a chip to a substrate, and in general can be applied for any application wherein an element needs to be soldered on a surface.

In the claims, reference signs shall not be construed as limiting the claim. The term "comprising" and "including" when used in this description or the appended claims should not be construed in an exclusive or exhaustive sense but rather in an inclusive sense. Thus the expression "comprising" as used herein does not exclude the presence of other elements or steps in addition to those listed in any claim. Furthermore, the words "a" and "an" shall not be construed as limited to "only one", but instead are used to mean "at least one", and do not exclude a plurality. Features that are not specifically or explicitly described or claimed may be additionally included in the structure of the invention within its scope.

The invention claimed is:

1. A method for applying a patterned structure on a receiving surface, the method comprising:
   providing a donor substrate between a light source and a receiving surface, wherein donor material is provided on a source surface of the donor substrate opposite a surface of the donor substrate facing the light source according to a patterning on the source surface; and
   providing, by the light source, a light pulse directed to the donor substrate,
   wherein the light pulse causes a transfer of the donor material from the source surface of the donor substrate onto the receiving surface,
   wherein the patterning on the source surface forms a pattern of:
      an occupied regions of the donor substrate providing donor material to the receiving surface, and an unoccupied regions of the donor substrate that does not provide donor material
      to the receiving surface,
   wherein the unoccupied regions are interspersed between the occupied regions, wherein, during the providing a light pulse, the donor material making up the occupied regions of the pattern is transferred as a whole, as a result of the light pulse so as to form a resulting pattern of donor material on the receiving surface,
   wherein a pixelated mesh is placed between the light source and the donor substrate, wherein the pixelated mesh is employed for obtaining a meshed light pattern directed to the donor substrate so as to at least partially subdivide the donor material provided on the source surface into smaller sub-portions when the donor material is transferred onto the receiving surface during the providing a light pulse, and
   wherein the meshed light pattern obtained using the pixelated mesh does not include the patterning on the source surface.

2. The method according to claim 1, wherein the pattern of donor material on the donor substrate is transferred as a whole by an illumination created by the light pulse, wherein the illumination covers both the occupied regions and the unoccupied regions.

3. The method according to claim 1, wherein discrete portions of the donor substrate comprising donor material are obtained at least in part by an indentations arranged on the donor substrate, wherein the indentations are arranged for holding the donor material.

4. The method according to claim 1, further comprising:
   treating at least a part of a surface of the donor substrate so as to change, at the part of the surface of the donor substrate, an adhesiveness between the surface of the donor substrate and the donor material.

5. The method according to claim 1, wherein discrete portions of the donor substrate comprising donor material are at least in part obtained by the donor substrate having a varying degree of an adhesiveness between the donor material and the donor substrate, and wherein the adhesiveness is higher at the occupied regions than at the unoccupied regions.

6. The method according to claim 1, wherein the donor substrate comprises a pattern of cells defining boundaries for containing the donor material inside the boundaries, wherein the occupied regions of the pattern are formed by selectively occupying a predefined subset of the cells.

7. The method according to claim 1, wherein a portion of the receiving surface on which the donor material is applied is curved.

8. The method according to claim 1, wherein the receiving surface is flexible and/or stretchable.

9. The method according to claim 1, wherein a mask is arranged over a portion of the donor substrate, between the light source and the donor substrate, for at least partly blocking the light pulse from reaching the portion of the donor substrate.

10. The method according to claim 1, wherein the donor material is a bonding material for bonding a chip to a substrate by thermal bonding.

11. The method according to claim 10, wherein patterning of the donor material on the source surface of the donor substrate matches a pre-existing pattern on the receiving surface to which the donor material is transferred in accordance with the providing a light pulse.

12. The method according to claim 1, wherein the method is carried out using roll-to-roll processing, comprising a step of embossing a donor substrate with a roll.

* * * * *